(12) United States Patent
Sneh

(10) Patent No.: US 6,863,021 B2
(45) Date of Patent: Mar. 8, 2005

(54) METHOD AND APPARATUS FOR PROVIDING AND INTEGRATING A GENERAL METAL DELIVERY SOURCE (GMDS) WITH ATOMIC LAYER DEPOSITION (ALD)

(75) Inventor: Ofer Sneh, Broomfield, CO (US)

(73) Assignee: Genus, Inc., Sunnyvale, CA (US)

(*) Notice: Subject to any disclaimer, the term of this patent is extended or adjusted under 35 U.S.C. 154(b) by 51 days.

(21) Appl. No.: 10/295,614

(22) Filed: Nov. 14, 2002

(65) Prior Publication Data

US 2004/0094093 A1 May 20, 2004

(51) Int. Cl.$^7$ .......................... C23C 16/00; H05H 1/00
(52) U.S. Cl. .................. 118/723 ME; 118/723 IR; 118/723 ER; 156/345.35; 156/345.36
(58) Field of Search .............. 118/723 IR, 723 ER, 118/723 ME, 724; 156/345.35, 345.36, 345.37, 345.48, 345.43, 345.27

(56) References Cited

U.S. PATENT DOCUMENTS

| | | | | |
|---|---|---|---|---|
| 3,614,658 A | * | 10/1971 | Goldsborough | 372/56 |
| 4,945,857 A | * | 8/1990 | Marinace | 118/719 |
| 4,971,832 A | * | 11/1990 | Arai et al. | 427/575 |
| 6,007,671 A | * | 12/1999 | Fujimura et al. | 156/345.27 |
| 6,071,572 A | * | 6/2000 | Mosely et al. | 427/570 |
| 6,112,696 A | * | 9/2000 | Gorin | 118/723 IR |
| 6,143,081 A | * | 11/2000 | Shinriki et al. | 118/719 |
| 6,225,745 B1 | * | 5/2001 | Srivastava | 315/111.51 |

OTHER PUBLICATIONS

Hassanzadeh et al, "Infrared Spectra of GeS, SGeS, SGeO, and OGeO in Solid Argon" J. Phys. Chem. 1992, vol. 96, pp. 6181–6185.*

* cited by examiner

Primary Examiner—Parviz Hassanzadeh
(74) Attorney, Agent, or Firm—Donald R. Boys; Central Coast Patent Agency, Inc.

(57) ABSTRACT

A General Metal Delivery Source (GMDS) for delivery of volatile metal compounds in gaseous form to processing apparatus has a reaction chamber holding a solid metal source material and connecting to the processing apparatus, and having an outlet for provision of the volatile metal compounds, a source heater coupled to the reaction chamber for heating said solid metal source material, a gas source for providing a reactive gas, a gas delivery conduit from the gas source to the reaction chamber for delivering gas species to the reaction chamber; and a plasma generation apparatus coupled to the gas delivery conduit. The plasma generation apparatus dissociates reactive gas molecules providing monatomic reactive species to the reaction chamber, and the monatomic reactive species combine with metal from the heated solid metal source material forming the volatile metal compounds.

15 Claims, 3 Drawing Sheets

METHOD AND APPARATUS FOR PROVIDING AND INTEGRATING A GENERAL METAL DELIVERY SOURCE (GMDS) WITH ATOMIC LAYER DEPOSITION (ALD)

CROSS-REFERENCE TO RELATED DOCUMENTS

This invention was made with government support under contract F33615-99-C-2961 awarded by the US Army Space and Missile Defense Command. The United States Government may therefore have certain rights to this invention.

FIELD OF THE INVENTION

The present invention is in the field of CVD processes including Atomic Layer Deposition (ALD), and pertains more particularly to methods and apparatus for preparing at point-of-process and delivering contaminant-free metal precursors in such processes.

BACKGROUND OF THE INVENTION

Requirements for ever-thinner thin film deposition, improved uniformity over larger surfaces, and higher production yields have been, and still are, the driving forces behind emerging technologies developed by the research community and commercialized by equipment manufactures for coating wafers to make electronic devices. As these devices become smaller and faster, the need for improved uniformity and better defined layer thickness, as well as film properties such as conductivity and the like, rises dramatically.

Various technologies well known in the art exist for applying thin films to wafers or other substrates in manufacturing steps for integrated circuits (ICs). Among the more established technologies available for applying thin films, Chemical Vapor Deposition (CVD) is an often-used commercialized processes. Atomic Layer Deposition (ALD), a variant of CVD, is flow emerging as a potentially superior method for achieving uniformity, excellent step coverage, and cost effective scalability to substrate size increase. ALD however, can exhibit a generally lower deposition throughput (typically <100 Å/min) than CVD, but is suitable for ultrathin films, less than typically 100 Å.

CVD is a flux-dependent technique requiring specific and uniform substrate temperature and stringent uniformity of precursors (chemical species) flux in order to produce a desired layer with uniform thickness and properties on a substrate surface. These stringent requirements become more challenging as substrate size increases, sometimes dictating additional chamber design complexity and manifold complications to sustain adequate film uniformity and properties. Another problem in CVD coating, wherein reactants and the products of reaction coexist in a close proximity to the deposition surface, is the probability of inclusion of reaction products and other contaminants in each deposited layer. Still further, highly reactive precursor molecules contribute to homogeneous gas phase reactions that can produce unwanted particles, which are detrimental to film quality and device performance.

Another critical area of thin film technology is the ability of a system to provide a high degree of uniformity and thickness control over a complex topology, referred to as step coverage. In the case of CVD, step-coverage typically exceeds typical physical vapor deposition (PVD) performance. However, certain disadvantages of CVD make ultrathin CVD films inadequate for many emerging critical semiconductor applications. For example, film initiation via nucleation deems CVD films discontinuous and practically useless for many sub 50 Å needs. Likewise, coating high aspect ratio features with conformal CVD films while maintaining film quality and adequate throughput is difficult.

ALD, although at present a slower process than CVD, demonstrates a remarkable ability to deposit uniform, ultrathin films over complex topology. This robust and inherent property comes from the flux independence of ALD. In addition, ALD implementation requires time and space separated molecular precursors which in turn circumvents gas phase reactions and therefore enables utilization of highly reactive precursor. Accordingly, ALD process temperatures are typically and advantageously lower than typical conventional CVD process temperatures.

ALD processes are executed by a series of self saturating surface processes. Generally, ALD is a process wherein conventional CVD processes are divided into single-monolayer depositions, in which each separate deposition step theoretically goes to saturation at a single molecular or atomic monolayer thickness and self-terminates when the layer formation occurs on the surface of a material. Generally, in the standard CVD process, the precursors are fed simultaneously into a reactor. In an ALD process the precursors are introduced into the reactor separately at different steps. Typically the precursors are introduced separately by alternating the flow of the precursor to combine with a carrier gas being introduced into the reactor while coexistence of the precursors in the reactor is suppressed by appropriately purging or evacuating the reactor in between successive introduction of precursors.

For example, when ALD is used to deposit a thin film layer on a material layer, such as a semiconductor substrate, saturating at a single molecular or atomic layer of thickness results in a formation of a pure desired film and eliminates the extra atoms that comprise the molecular precursors (or ligands). By the use of alternating precursors, ALD allows for single layer growth per cycle so that much tighter thickness controls can be exercised to deposit an ultra thin film. Additionally, ALD films may be grown with continuity with thickness that is as thin as a monolayer (3-5 Angstroms). This capability is a unique characteristic of ALD films that makes them superior candidates for applications that require ultrathin films. A good reference work in the field of Atomic Layer Epitaxy, which provides a discussion of the underlying concepts incorporated in ALD, is Chapter 14, written by Tuomo Suntola, of the Handbook in Crystal Growth, Vol. 3, edited by D. T. J. Hurle, © 1994 by Elsevier Science B. V. The Chapter title is "Atomic Layer Epitaxy". This reference is incorporated herein by reference as background information.

The unique mechanism of film formation provided by ALD offers several advantages over previously discussed technologies. One advantage derives from the flux-independent nature of ALD contributing to some relaxed reactor design-rules and scaling. Device technology is progressing at a rapid rate driving improvements of commercial deposition-equipment technology. While industry road maps for advanced and future device requirements are fairly well established, some critical applications cannot be realized by existing process technologies. For example, it is desired that commercial viability be attained for high quality dielectric laminate processes used in devices such as dielectric memory capacitors, RF products, "systems on a chip" applications, and advanced gate dielectrics with metal oxide gates.

ALD processes have often relied on solid source materials that are heated (e.g. a Knudsen thermal vaporizer source from a low vapor pressure Metal halide solid) to produce adequate precursor exposure. However, high temperature sources dictate that all manifolds located downstream to the hot sources are maintained at (or above) the source temperature. These temperatures and their maintenance are trivial to maintain throughout passive manifold components such as tubings, diffusers etc. However, valves that are necessary to produce time controlled pulsed introduction of precursors, which are key for ALD, are typically limited in service temperature, especially when corrosive precursors are involved. Accordingly, usage of many desired solid precursors poses insurmountable performance and reliability limitations on ALD manifolds deeming them inadequate for semiconductor manufacturing. Although several solid precursor delivery systems have been proposed and are implemented with more or less success in research and development, there are no known systems, thus far, that are properly suitable for high volume manufacturing. Existing systems are typically maintenance intensive, low throughput, contaminating and inefficient.

To overcome the deficiencies of conventional heated solid sources a General Metal precursor Delivery System (GMDS) technique is described in this patent. This source is relatively generic and capable of pulse delivering a variety of metal precursor into ALD reactors. Preferably, GMDS is implemented by an embodiment that maintains critical manifold components such as valves at temperatures that are compatible with low maintenance operation. Additionally, the GMDS is capable of providing high fluxes of low vapor pressure precursors. Such a system may be integrated with ALD deposition systems to enhance their capabilities.

SUMMARY OF THE INVENTION

In a preferred embodiment of the present invention a general metal delivery source for delivery of volatile metal compounds in gaseous form to a processing apparatus is provided, comprising a reaction chamber holding a solid metal source material and connecting to the processing apparatus, and having an outlet for delivery of the volatile metal compounds to said processing apparatus, a source heater within the reaction chamber for heating said solid metal source material, a gas source for providing a reactive gas, a gas delivery conduit from the gas source to the reaction chamber for delivering gas species to the reaction chamber, and a dissociation apparatus coupled to the gas delivery conduit. The general metal delivery source is characterized in that the dissociation apparatus dissociates the reactive gas molecules providing at least a monatomic reactive species to the reaction chamber, and the monatomic reactive species combine with metal from the heated solid metal source material forming the volatile metal compounds.

In some preferred embodiments the gas delivery conduit and the reaction chamber comprise a common quartz tubing. Also in some preferred embodiments the plasma generation apparatus comprises a helical resonator. In some applications the solid metal source material is Tantalum and the reactive gas is Chlorine. The gas source in some embodiments may be valved in a manner that rapid pulses of reactive gas are provided to the reaction chamber, providing thereby rapid pulses of the volatile metal compounds at the reaction chamber outlet. In some embodiments the dissociation apparatus comprises a plasma generator.

In another aspect of the invention a method for providing volatile metal compounds at an outlet of a reaction chamber is provided, comprising the steps of (a) flowing a reactive gas from a gas source into a gas delivery conduit connected to a heated reaction chamber holding a solid metal source; (b) striking a plasma in the flowing reactive gas, thereby forming monatomic species of the reactive gas; (c) forming the volatile metal compound in the reaction chamber through chemical reaction between the heated metal source and the monatomic reactive gas; and (d) delivering the volatile metal compound at an outlet of the reaction chamber.

In some preferred embodiments the reaction chamber and the gas delivery conduit comprise a common quartz tubing. Also in some preferred embodiments the plasma generation apparatus comprises a helical resonator.

In some applications the solid metal source material is Tantalum and the reactive gas is Chlorine. Further, the gas source may be valved in a manner that rapid pulses of reactive gas are provided to the reaction chamber, providing thereby rapid pulses of the volatile metal compounds at the reaction chamber outlet.

In yet another aspect of the invention a processing system is provided, comprising a heated hearth for supporting a substrate in a coating chamber, apparatus for exchanging substrates for sequential processing, an inlet port for delivering a volatile metal compound as a precursor to the coating chamber; and a general metal delivery source connected to the inlet port, the general metal delivery source comprising: a reaction chamber holding a solid metal source material and having an outlet for delivery of the volatile metal compounds to said coating chamber, a heater within the reaction chamber for heating said solid metal source material, a gas source for providing a reactive gas, a gas delivery conduit from the gas source to the reaction chamber for delivering gas species to the reaction chamber, and a plasma generation apparatus coupled to the gas delivery conduit. The plasma generation apparatus dissociates reactive gas molecules, providing at least a monatomic reactive species to the reaction chamber, and the monatomic reactive species combine with metal from the heated solid metal source material forming the volatile metal compounds delivered to the coating chamber.

In some preferred embodiments the gas delivery conduit and the reaction chamber comprise a common quartz tubing. Also in some preferred embodiments the plasma generation apparatus comprises a helical resonator. In some applications the solid metal source material is Tantalum and the reactive gas is Chlorine.

In some preferred embodiments the gas source is valved in a manner that rapid pulses of reactive gas are provided to the reaction chamber, providing thereby rapid pulses of the volatile metal compounds at the reaction chamber outlet. Also in some preferred embodiments the system may be configured for and dedicated to chemical vapor deposition, or in other embodiments for atomic layer deposition.

In yet another aspect of the invention a chemical vapor deposition (CVD) system is provided, comprising an inlet port for delivering a volatile metal compound as a precursor for CVD processing, and a general metal delivery source connected to the inlet port, the general metal delivery source comprising a reaction chamber holding a solid metal source material and having an outlet for delivery of the volatile metal compounds to said coating chamber, a heater within the reaction chamber for heating said solid metal source material, a gas source for providing a reactive gas, a gas delivery conduit from the gas source to the reaction chamber for delivering gas species to the reaction chamber, and a dissociation apparatus coupled to the gas delivery conduit. Plasma generation apparatus dissociates reactive gas molecules, providing at least a monatomic reactive species to the reaction chamber, and the monatomic reactive species combine with metal from the heated solid metal source material forming the volatile metal compounds delivered to the inlet port.

In still another aspect of the invention an atomic layer deposition (ALD) system is provided, comprising an inlet port for repeated delivery of a volatile metal compound as a precursor for ALD processing, and a general metal delivery source coupled to the inlet port, the general metal delivery source comprising a reaction chamber holding a solid metal source material and having an outlet for delivery of the volatile metal compounds to said coating chamber, a heater within the reaction chamber for heating said solid metal source material, a gas source for providing a reactive gas, a gas delivery conduit from the gas source to the reaction chamber for delivering gas species to the reaction chamber, and a dissociation apparatus coupled to the gas delivery conduit. The plasma generation apparatus dissociates reactive gas molecules, providing at least a monatomic reactive species to the reaction chamber, and the monatomic reactive species combine with metal from the heated solid metal source material forming the volatile metal compounds delivered to the inlet port.

In embodiments of the invention taught in enabling detail below, for the first time a general metal delivery source is provided that can deliver, from solid sources, volatile precursors bearing the metal, or in some cases non-metal elements, for a wide variety of processes

BRIEF DESCRIPTION OF THE DRAWING FIGURES

DESCRIPTION OF THE PREFERRED EMBODIMENTS

Figure 1:
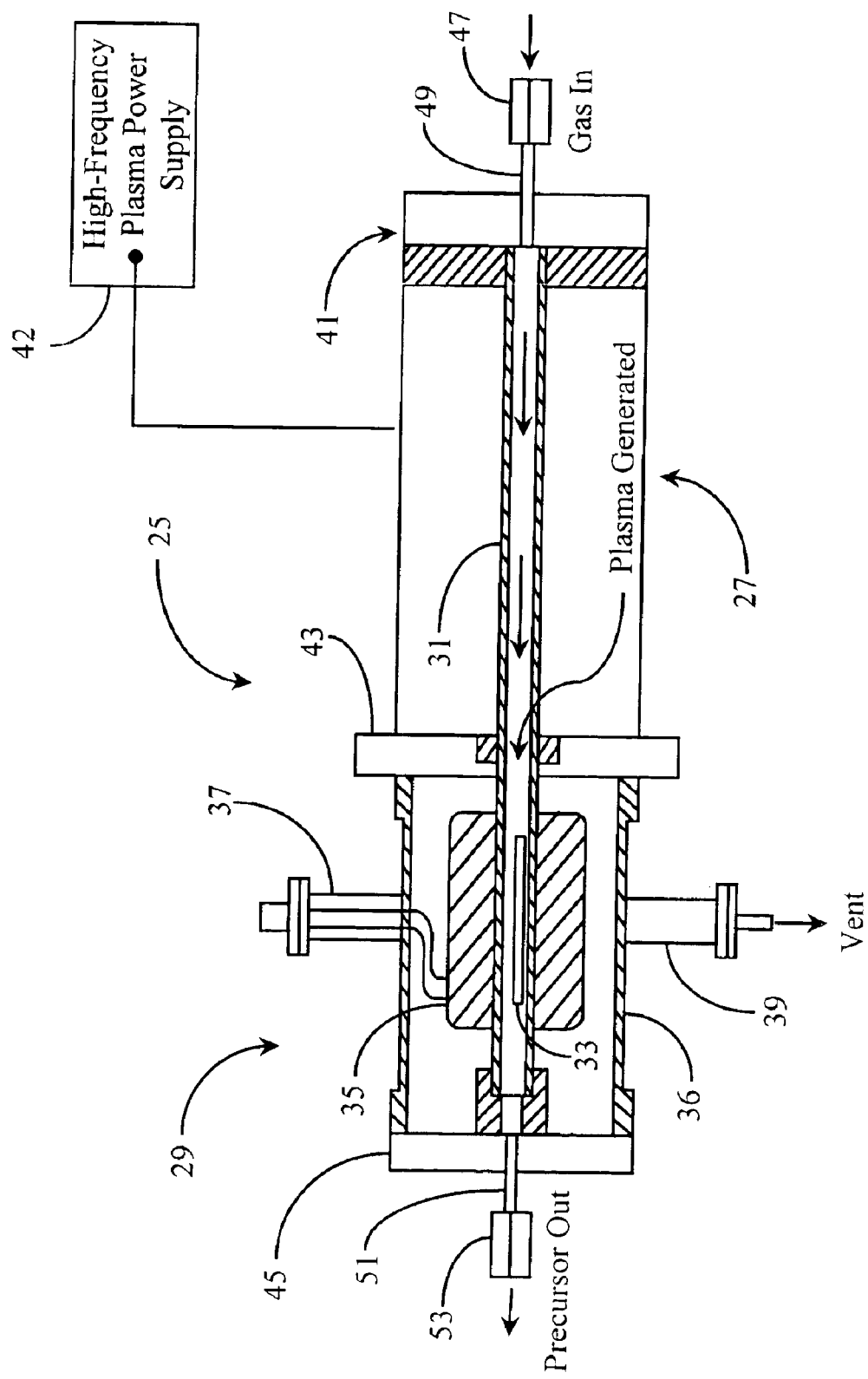
FIG. 1 is a sectioned view of a plasma-based General Metal Delivery System (GMDS) according to an embodiment of the present invention.

Solid metal source materials are being considered and studied for a variety of film applications, such as insulators (metal oxides), metal nitride and metal films. These efforts are limited in execution because metal halide sources are desired, but volatile halide metal sources are rare. Some metal organic liquid sources have good volatility, but may or will provide carbon contamination by parasitic incorporation into the film. Liquid metal-organic sources may also be difficult to handle safely, although industry uses them with the added cost of specialized containment practices.

Apparatuses are used in CVD that deliver vapors from liquid delivery lines and evaporate the liquid sources. These apparatuses apply liquid delivery lines and evaporate the liquid in metered fashion through a heatable nozzle or a heatable porous glass frit. These delivery schemes are or may not be suitable for commercial ALD applications due to a long time response.

Most metal halide precursors are highly corrosive. If these materials are to be pulsed through conventional pneumatic or solenoid valves at the temperature that is necessary to sustain practical vapor pressure of these solid precursors, the valves may substantially corrode leading to deterioration and breakdown. In addition, limitation of ultra high purity (UHP) valves specifications into the temperature range below ~120° C. pose significant restriction over attainable vapor pressure of non-volatile compounds.

ALD relies on pulsed flow of the precursors into the film deposition chamber. The precursors must be introduced for short periods of time. Corrosive solids with low vapor pressure must typically be heated to high temperatures to achieve adequate vapor pressures. The vapors are transferred through heatable lines into the reaction chambers. These materials will clog and/or corrode any type of valve. Therefore, creating flow pulses of these materials is a technical challenge.

A solution for the delivery of low vapor pressure materials is described in general by T. Suntola, Handbook of Crystal Growth 3, edited by D. T. J. Hurle, Elsevier, 1994, pp. 616–621, which is incorporated into the present specification by reference. The figure in this reference on p. 619 indicates source(s) that can provide a heated (Knudsen cell-like) solid metal precursor source (e.g. $TaCl_5$). These ALD sources are controlled by a single low temperature UHP valve that is capable of routing an inert gas into the heated reactant source(s) when the source is at the "ON" state. Advantageously, the source is using a single valve that is located upstream to the Knudsen cell and can be maintained at relatively lower temperatures. The "OFF" state of the source is maintained by a side loop of inert gas flowing to the outlet of the Knudsen cell. Since the inlet to the Knudsen cell is connected to a vacuum pump, back flow of inert gas entering the cell from the outlet is designed to prevent downstream flow of chemical by reversing the flow and delivering the chemical into the vacuum pump. An appropriately selected set of capillaries is set to maintain material loss during the "OFF" state at minimum. This source was widely implemented in research and development and has been capable to deliver metal precursors requiring temperatures in excess of 250° C. Unfortunately, under prolonged utilization that is necessary in the production environment, it is quite difficult to maintain conditions that prevent condensation and solidification of the solid material and subsequent disadvantageous clogging of the cold valve. This problem is mainly related to back-diffusion of vapor into the stagnant leg (from the valve to the Knudsen cell) when the source is at the "OFF" state. This leg is dictated by the need to provide a thermal barrier between a hot Knudsen-cell and the back capillary that are typically placed within a vacuum enclosure and the inert gas valve that is typically placed outside the vacuum and maintained at substantially cooler temperatures. This limitation is believed to be generic to the prior-art source and not to specific engineering of a particular system. Accordingly, maintaining the source at optimum performance dictated overhaul type maintenance with rather impractically frequent schedule. In addition, frequent vacuum line (the backstreaming line to the vacuum pump) clogging, typically makes this source even more maintenance intensive. Finally, creeping of solid material into the inlet line induces deterioration of the "OFF" state and the ALD process. The deterioration of the "OFF" state was almost immediate and was blamed for progressively increased CVD component in ALD films.

A substantial design improvement and precursor delivery methodology must be formulated and implemented. Such a general metal deposition source (GMDS) is provided by the inventor and disclosed in enabling detail below. The GMDS generates metal precursors at the point of use. The challenge of generating time-controlled pulses of non-volatile metal precursors is addressed by the unique design of the GMDS that is described below. The basic design is illustrated in the more detailed drawings described below.

FIG. 1 is a sectioned view of a plasma-enhanced GMDS 25 according to an embodiment of the present invention. In GMDS 25 solid metal source 33 is combined with one or more elements introduced as gases. In a preferred embodiment atoms or molecules of the introduced elements are substantially dissociated or otherwise excited prior to introduction to increase reactivity.

As an example for the use of GMDS 25, production of volatile $TaCl_5$ is described, using a solid tantalum source and substantially dissociated Chlorine. GMDS 25 in this example generates volatile $TaCl_5$ at the point of use, beyond conduit 51 through fitting 53. The generation of timed pulses of the reactive metal precursors is induced by a timed generation of dissociated chlorine. The timed generation of reactive chlorine is produced upstream to the source where cooler manifolds and valves are operating at optimum conditions, eliminating the need to operate valves at high temperatures. A plasma generator component 27 powered by a high-voltage, high frequency power supply 42 is provided for the purpose of maintaining a constant plasma source that breaks $Cl_2$ molecules into more reactive Cl atoms for the purpose of obtaining increased chemical reactivity in combining with Ta to produce the volatile precursor, $TaCl_5$. In a preferred embodiment plasma generator 27 is a helical resonator customized for this use. A furnace assembly 29 is provided and adapted to heat a solid Ta metallic source 33 which is placed in a quartz tube 31 adapted to contain both the source Ta 33 and the generated plasma. Quartz tube 31 extends through both the plasma generator and the heated region carrying the solid Ta source material.

A heating element 35 provides a direct and adjustable heat source to Ta 33. In a preferred embodiment, the furnace power is regulated to control the temperature in the range from 200–400 degrees Celsius.

Furnace assembly 29 is a double walled enclosure separated from component 27 by a flange 43 and likewise from the reactor side by an end-flange 45. However, an unrestricted free flow capability is maintained through the interior of shared tube 31. A thermocouple housing 37 is provided and adapted to house thermocouples for gauging oven temperature as is known in the art. Furnace assembly 29 has a double containment exterior 36 adapted to prevent leakage. A vent outlet 39 is provided and adapted to allow venting of the system as is also known in the art. Fittings 53 and 47 provide connection to a deposition reactor and the upstream gas delivery manifold respectively.

In a preferred embodiment of the present invention, a Noble gas—halide mixture such as $Cl_2$ and Ar is introduced for two reasons. The first is that during the reactive phase $TaCl_5$ precursor is generated very quickly and in large amounts within 5 to 40 msec. A time resolution for an ALD reactive phase is approximately 100 msec. Therefore a dilution of the $Cl_2$ by mixing with a Noble gas is appropriate to protect against excessive precursor generation. Secondly, using a Noble gas such as Ar, for example, allows the plasma to be maintained continuously eliminating plasma generation time. In this way, when $Cl_2$ flow is turned off, then etching of the Ta source ($TaCl_5$ production) ceases even though plasma is kept on and maintained by a continuous Ar flow. Alternatively, the plasma may, in some instances, be timed to coincide with the introduction of $Cl_2$ gas.

The $Cl_2$/Noble mixture is introduced into tube 31 through fitting 47 by way of conduit 49 through flange 41. The mixture is passed through the helical resonator (Plasma generation) to produce the more reactive Cl atoms at a flow of approximately 20 standard cubic centimeters per minute (SCCM) in one embodiment. Cl atoms are generated at approximately useful rates (e.g. at approximately 30 sccm). The atoms react with Ta 33 in tube 31 to etch the metal producing highly volatile $TaCl_5$ (at the temperature that furnace, 29, is maintained). Furnace 29 keeps Ta 33 heated to a high enough temperature to operate in a flux-limited mode by desorbing the etch product molecules faster than generation rate. The precursor is flowed into an ALD reactor through fitting 53.

A method for suppressing contaminant formation is also utilized by GMDS 25 as is described below.

Figure 2:
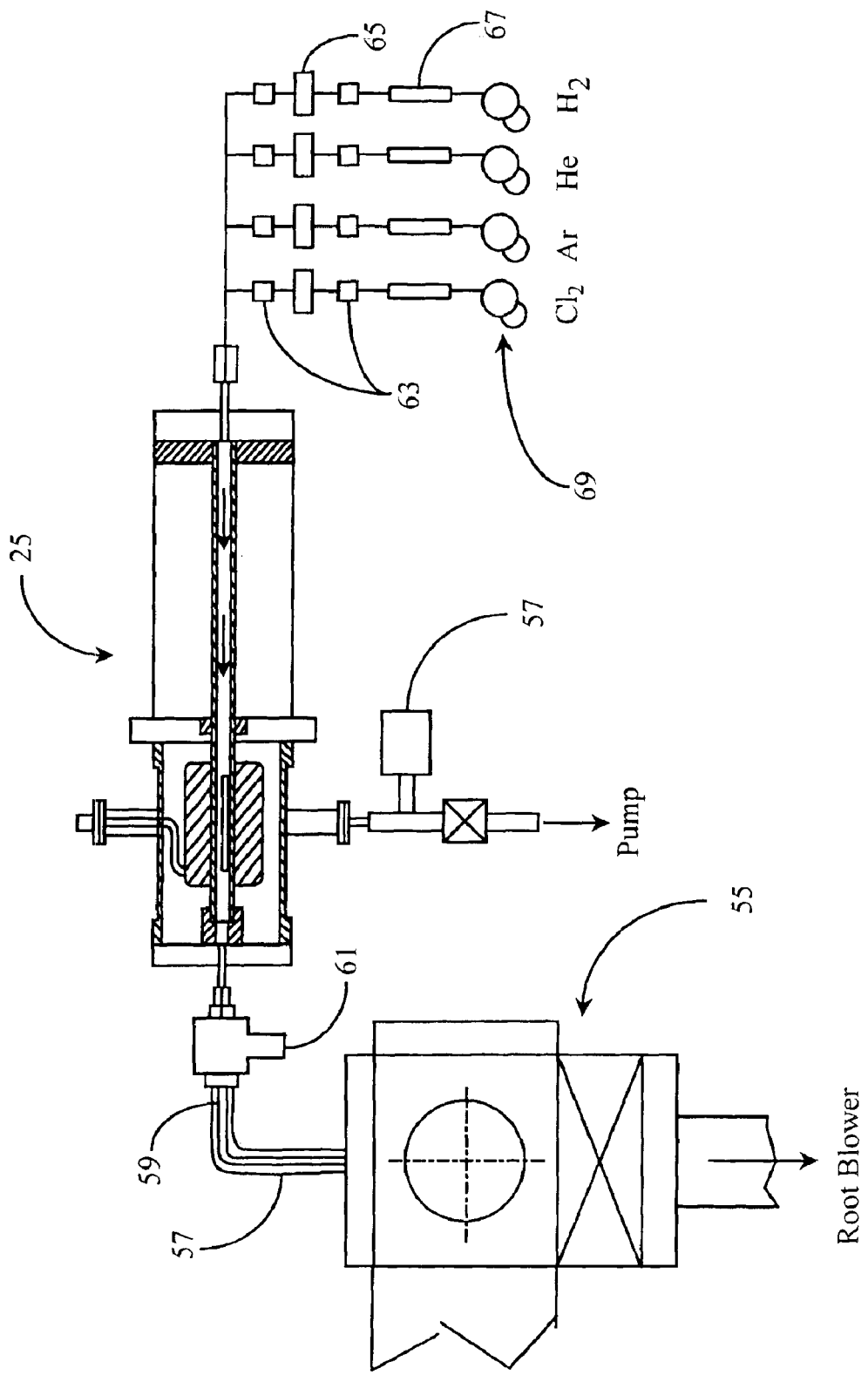
FIG. 2 is a block diagram illustrating the GMDS of FIG. 1 connected to an ALD reactor according to an embodiment of the present invention.

FIG. 2 is a cross sectional illustration presenting GMDS 25 of FIG. 1 interconnected to an ALD reactor 55 and gas sources according to an embodiment of the present invention. Reactor 55 has apparatus for maintaining a partial vacuum, and for supporting a substrate, usually a silicon wafer, on a heated hearth during deposition processes. GMDS 25 is approximately 18 inches in overall length and compact enough to easily be fitted and integrated into virtually any ALD or CVD system. In this example, GMDS 25 is illustrated as connected to an ALD reactor 55.

During delivery of $TaCL_5$ into reactor 55, it is important that no solid precursor reforms on the walls of a delivery line. Moreover, it is equally important that no Cl atoms be allowed to pass into chamber 55 where they may become a source of contamination. Adding a nickel-plated delivery line 59 and a standard line heater 57 alleviates these concerns. Nickel plating on the inside of line 59 acts to quench Cl atoms before they enter reactor 55. In this way, no contamination results from chlorine being inadvertently introduced into reactor 55. Line 59 is kept heated to approximately 90° C. effectively preventing precursor from clogging line 59 and an associated pinch valve 61. The preferred length of line 59 shall be sufficient enough to fully quench Cl atoms. Moreover, since no $TaCl_5$ is allowed to solidify as a on the walls, no subsequent flaking of the solid precursor will occur eliminating notorious upstream generation of particles. Maintenance cleaning time is substantially reduced using GMDS 25 due to the improvements cited above.

On the carrier-source end of GMDS 25, there are four regulated gas lines illustrated, with each line responsible for introducing a specific gas. The choice of reactive and Noble gas types will depend upon the choice of solid source types and desired precursor. Fluorine, Bromine, and other commonly known metal-etching gases may also be used. Further, although use of Noble gases is preferred, in some cases other gases, such as Nitrogen, may be used.

It is important to regulate the upstream flow of reactive and Noble gasses into GMDS 25. To that end, standard valves 63 are provided in each separate line to enable turning the gas flow ON or OFF. Flow restrictors 65 are similarly provided to restrict flow rates and to provide measured, pulsed flow in ALD processes, wherein the valves in each supply line are cycled alternately. Each line has a mass flow meter (MFM) 67 to aid in adjusting flow as well as upstream pressure regulators, 69. $H_2$ may be used to assist with plasma control as is known in the art. In preferred embodiments control is by software dedicated to the process purposes.

It will be apparent to one with skill in the art that the unique implementation of GMDS 25 may be integrated with a wide variety of ALD processes for a variety of films and applications, as well as CVD applications without departing from the spirit and scope of the present invention. As research continues regarding optimum metallic sources and associated reactant gasses progresses, new and future process materials and interaction paths may be perfected for commercial use in the production of high quality dielectrics and conducting films for electronic devices.

Figure 3:
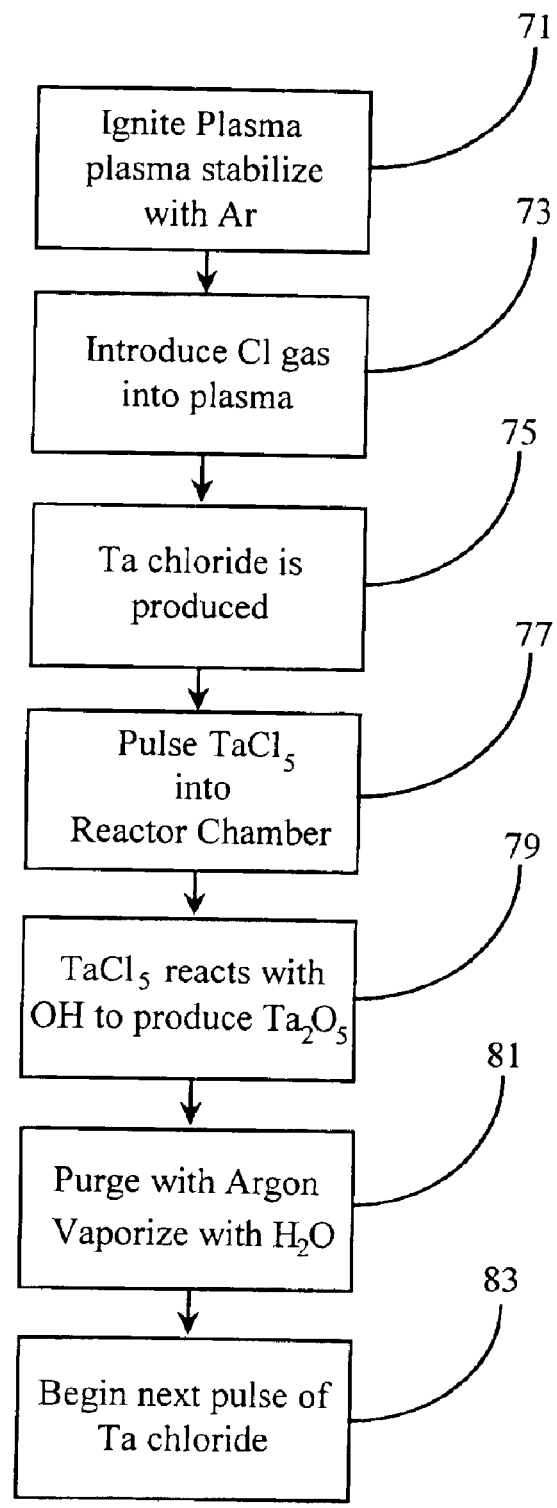
FIG. 3 is a process flow diagram illustrating basic process steps using tantalum, chlorine, and argon in a $Ta_2O_5$ ALD process according to an embodiment of the present invention.

FIG. 3 is a process flow diagram illustrating basic process steps using tantalum, chlorine, and argon in a $Ta_2O_5$ ALD process according to an embodiment of the present invention. Although the process steps represented herein describe a self-terminating ALD cycle, continuous precursor flow may be used in other applications such as with standard CVD.

In step 71, plasma is ignited and stabilized with a continuous flow of argon. Alternatively, plasma may be timed to pulse with the reactive gas. In step 73, reactive gas such as $Cl_2$ is introduced into a helical resonator (plasma generation). In this step, $Cl_2$ may be mixed with a Noble gas such as Ar for reasons previously described.

In step 75 Cl atoms produced in plasma subsequently etch the Ta source to produce highly volatile $TaCl_5$, which in this example is the desired precursor. In step 77 $TaCl_5$ produced in step 75 is pulsed into a suitable ALD reactor, or alternatively, introduced as a continuous flow into a suitable CVD reactor. Obviously, if the process is CVD, the oxygen containing precursor would be introduced to the CVD reactor concurrently with the $TaCl_5$. For the sake of simplicity, FIG. 3 concentrates on the ALD process.

In step 79, $TaCl_5$ reacts with a prepared substrate surface (OH) to produce a desired $Ta_2O_5$ layer. In step 81, separate purge (Ar) and surface reaction with $H_2O$ vapor is performed to prepare the substrate surface for a next pulse of metal precursor. The cycle repeats with step 83, which is the next pulse of $TaCl_5$.

The innovative design and implementation of an efficient and contamination free GMDS such as GMDS 25 greatly improves throughput and quality in the fabrication of ALD films for various applications. Solid metallic sources, which are more available in pure and refined ingots, safer to handle, and more common than gas or liquid metallic sources may now be conveniently used without experiencing downtime delays associated with the need to control particulate contamination and cleaning requirements which are typical in prior-art applications that use solid compound sources. Lower temperatures may be used for heating source metals and shorter pulse intervals may be achieved due to higher reaction rates. GMSD 25, as a process-independent chemical-delivery source, may be used in general CVD as well as in ALD without departing from the spirit and scope of the present invention.

In the above descriptions Tantalum (Ta) has been described as a solid source, used with dissociated chlorine, preferably mixed with a Noble gas, such as Argon. It was also described that the choice of reactive and Noble gas types will depend upon the choice of solid source types and desired precursor. Fluorine, Bromine, and other commonly known metal-etching gases may be used. There are similarly a variety of solid materials that may be used, depending on the volatile precursor desired. For example, using the well-known scientific notations for elements, the following may all be considered as candidate solid sources in embodiments of the invention: Ta, Zr, Hf, W, Nb, Mo, Bi, Zn, Pb, Mg, Ba, Sr, Cr, Co, P, Sr, As, Ni, Ir and others.

It will also be apparent to anyone who is properly skilled in the art that a variety of changes may be made in the embodiments described above without departing from the spirit and scope of the present invention. The apparatus used for dissociation (plasma formation) and its power supply may be any of a number of commercially available or custom made devices. Moreover, there are a broad variety of metals that may be used, and source temperatures and the like. In addition, there are elemental materials such as Ge and Si which also form halides, and that may be used within the operational and functional scope of the invention, even though these materials may not be strictly classified as metals. Further the devices described in various embodiments may be used for steady flow CVD processes and also for interrupted flow (pulsed) ALD processes. Still further, the gas streams may be combined with other carrier gases, such as Nitrogen if inert in the operation of the source, and may also be combined with or blended with other inert gases in the downstream wafer reactor area and space. Typically the GMDS of the invention will be attached upstream to an ALD reactor or a CVD reactor, and typically these production systems have apparatus for cycling a series of substrates sequentially through the ALD or CVD reactor and a heated hearth for supporting and heating a substrate in process. The spirit and scope of the present invention is limited only by the claims that follow.

What is claimed is:

1. A general metal delivery source for delivery of volatile metal compounds in gaseous form to processing apparatus, comprising:

a reaction chamber holding a solid metal source material and connecting to the processing apparatus, and having an outlet for delivery of the volatile metal compounds to said processing apparatus;

a source heater within the reaction chamber for heating said solid metal source material;

a gas source for providing a reactive gas;

a gas delivery conduit from the gas source to the reaction chamber for delivering gas species to the reaction chamber; and a dissociation apparatus coupled to the gas delivery conduit prior to the reaction chamber;

wherein the dissociation apparatus dissociates the reactive gas molecules providing at least a monatomic reactive species to the reaction chamber, and the monatomic reactive species combine with metal from the heated solid metal source material forming the volatile metal compounds.

2. The general metal delivery source of claim 1 wherein the gas delivery conduit and the reaction chamber comprise a common quartz tubing.

3. The general metal delivery source of claim 1 wherein the gas source is valved in a manner that rapid pulses of reactive gas are provided to the reaction chamber, providing thereby rapid pulses of the volatile metal compounds at the reaction chamber outlet.

4. The general metal delivery source of claim 1 wherein the dissociation apparatus comprises a plasma generator.

5. The general metal delivery source of claim 1 wherein the plasma generation apparatus comprises a helical resonator.

6. The general metal delivery source of claim 1 wherein the solid metal source material is Tantalum and the reactive gas is Chlorine.

7. A processing system comprising:

a heated hearth for supporting a substrate in a process deposition chamber;

apparatus for exchanging substrates for sequential processing;

an inlet port for delivering a volatile metal compound as a precursor to the coating chamber; and a general metal delivery source connected to the inlet port, the general metal delivery source comprising:
- a reaction chamber holding a solid metal source material and having an outlet for delivery of the volatile metal compounds to said coating chamber;
- a heater within the reaction chamber for heating said solid metal source material;
- a gas source for providing a reactive gas;
- a gas delivery conduit from the gas source to the reaction chamber for delivering gas species to the reaction chamber; and
- a plasma generation apparatus coupled to the gas delivery conduit prior to the reaction chamber;

wherein the plasma generation apparatus dissociates reactive gas molecules, providing at least a monatomic reactive species to the reaction chamber, and the monatomic reactive species combine with metal from the heated solid metal source material forming the volatile metal compounds delivered to the coating chamber.

8. The processing system of claim 7 wherein the gas delivery conduit and the reaction chamber comprise a common quartz tubing.

9. The processing system of claim 7 wherein the gas source is valved in a manner that rapid pulses of reactive gas are provided to the reaction chamber, providing thereby rapid pulses of the volatile metal compounds at the reaction chamber outlet.

10. The processing system of claim 7 wherein the plasma generation apparatus comprises a helical resonator.

11. The processing system of claim 7 wherein the solid metal source material is Tantalum and the reactive gas is Chlorine.

12. The processing system of claim 7 configured for and dedicated to chemical vapor deposition.

13. The processing system of claim 7 configured for and dedicated to atomic layer deposition.

14. A chemical vapor deposition (CVD) system comprising:
- an inlet port for delivering a volatile metal compound as a precursor for CVD processing; and
- a general metal delivery source connected to the inlet port, the general metal delivery source comprising a reaction chamber holding a solid metal source material and having an outlet for delivery of the volatile metal compounds to said coating chamber, a heater within the reaction chamber for heating said solid metal source material, a gas source for providing a reactive gas, a gas delivery conduit from the gas source to the reaction chamber for delivering gas species to the reaction chamber, and a dissociation apparatus coupled to the gas delivery conduit prior to the reaction chamber;

wherein the dissociation apparatus dissociates reactive gas molecules, providing at least a monatomic reactive species to the reaction chamber, and the monatomic reactive species combine with metal from the heated solid metal source material forming the volatile metal compounds delivered to the inlet port.

15. An atomic layer deposition (ALD) system comprising:
- an inlet port for repeated delivery of a volatile metal compound as a precursor for ALD processing; and
- a general metal delivery source coupled to the inlet port, the general metal delivery source comprising a reaction chamber holding a solid metal source material and having an outlet for delivery of the volatile metal compounds to said coating chamber, a heater within the reaction chamber for heating said solid metal source material, a gas source for providing a reactive gas, a gas delivery conduit from the gas source to the reaction chamber for delivering gas species to the reaction chamber, and a dissociation apparatus coupled to the gas delivery conduit prior to the reaction chamber;

wherein the dissociation apparatus dissociates reactive gas molecules, providing at least a monatomic reactive species to the reaction chamber, and the monatomic reactive species combine with metal from the heated solid metal source material forming the volatile metal compounds delivered to the inlet port.

* * * * *